(12) United States Patent
Terlizzi

(10) Patent No.: US 8,405,402 B2
(45) Date of Patent: Mar. 26, 2013

(54) SYSTEMS AND METHODS FOR ADJUSTING SIGNALING PROPERTIES BASED ON CABLE ATTRIBUTES

(75) Inventor: Jeffrey J. Terlizzi, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 664 days.

(21) Appl. No.: 12/469,141

(22) Filed: May 20, 2009

(65) Prior Publication Data

US 2010/0299449 A1 Nov. 25, 2010

(51) Int. Cl.
*G01R 31/02* (2006.01)

(52) U.S. Cl. ........................................ 324/539

(58) Field of Classification Search .................. None
See application file for complete search history.

(56) References Cited

U.S. PATENT DOCUMENTS

| | | | |
|---|---|---|---|
| 6,211,649 B1 | 4/2001 | Matsuda | |
| 6,448,863 B1 | 9/2002 | Ogawa et al. | |
| 6,452,975 B1 * | 9/2002 | Hannah | 375/257 |
| 6,885,180 B2 * | 4/2005 | Benson et al. | 324/66 |
| 7,340,363 B2 * | 3/2008 | Tsai | 702/117 |
| 7,346,728 B1 | 3/2008 | Jackson | |
| 7,375,532 B1 * | 5/2008 | Lo et al. | 324/534 |
| 7,403,018 B1 * | 7/2008 | Lo et al. | 324/533 |
| 7,738,387 B2 * | 6/2010 | Diab et al. | 324/500 |
| 7,839,133 B2 * | 11/2010 | Blanchard | 324/66 |
| 7,940,681 B2 * | 5/2011 | Diab et al. | 324/500 |
| 2004/0174153 A1 * | 9/2004 | Benson et al. | 324/66 |
| 2006/0021785 A1 * | 2/2006 | Kamata et al. | 174/112 |
| 2007/0016835 A1 | 1/2007 | Hronik et al. | |
| 2007/0195711 A1 * | 8/2007 | Morris et al. | 370/254 |
| 2009/0267613 A1 * | 10/2009 | Terlizzi et al. | 324/538 |
| 2009/0304059 A1 * | 12/2009 | Bishop | 375/222 |

FOREIGN PATENT DOCUMENTS

| | | | |
|---|---|---|---|
| GB | 2204409 A | * | 11/1988 |
| JP | 2005069478 A | * | 3/2005 |

* cited by examiner

*Primary Examiner* — Jermele M Hollington
(74) *Attorney, Agent, or Firm* — Dorsey & Whitney LLP

(57) ABSTRACT

This is generally directed to adjusting signaling properties based on cable attributes. In some embodiments, the cable attributes can include information such as the length of a cable, the diameter of a cable, the type of plug on a cable, the type of or presence of shielding on a cable, or any combination of the above. This information can then be used to determine the appropriate signaling properties for that cable (e.g., with respect to an EMC standard). The appropriate signaling properties may, for example, optimize the signal that is used to drive the cable while still allowing the cable to generate emissions that are within acceptable EMC standards. In some embodiments, the appropriate signaling properties can include factors such as the drive strength of the signal, the slew rate of the signal, the maximum voltage of the signal, the frequency of the signal, or any combination of the above.

23 Claims, 5 Drawing Sheets

SYSTEMS AND METHODS FOR ADJUSTING SIGNALING PROPERTIES BASED ON CABLE ATTRIBUTES

FIELD OF THE DISCLOSURE

This relates to systems and methods for adjusting signaling properties based on cable attributes. In particular, this relates to systems and methods for adjusting signaling properties of a driving signal based on the identity of that cable.

BACKGROUND OF THE DISCLOSURE

The operation of electronic circuits in close proximity can give rise to electromagnetic interference ("EMI"), radio frequency interference ("RFI"), or other noise between the electronic circuits. This noise can also occur at a larger scale between various systems such as, for example, electronic devices, cables, and antennas that are near one another. Generally, the source of this noise can be attributed to the radiation "emissions" that are generated by the operation of these systems.

Due to the interference that can be caused by such emissions, regulating bodies have established various Electromagnetic Compatibility ("EMC") standards that require a system to generate less than a set amount of emissions. For example, in the United States, regulating bodies such as the Federal Communications Commission, United States Department of Defense, and International Special Committee on Radio Interferences have established various EMC standards to control radiation emissions.

SUMMARY OF THE DISCLOSURE

Systems and methods for adjusting signaling properties based on cable attributes are provided. In particular, systems and methods for adjusting the signaling properties of a driving signal based on that cable's identity are provided.

In some embodiments, the identity of the cable can include information such as the cable-type or cable attributes of the cable. The cable attributes can include, for example, information such as the length of the cable, the diameter of the cable, the type of cable plug, the type or presence of cable shielding, or any other suitable cable attribute.

In some embodiments, the identity of the cable can be determined by communicating with cable circuitry of the cable. For example, a signal can be received from the cable circuitry that is associated with the identity (e.g., the cable-type or cable attributes) of the cable. The signal can include, for example, a series of power signal pulses, a series of sine waves, a series of bits, or any other suitable signal. In some embodiments, the cable can be hardwired in a manner that is associated with the identity of the cable. For example, a particular combination of pins on the plug of the cable can be shorted, can be maintained at a certain voltage level, or both. This particular combination of pins can then be associated with the identity of the cable.

In some embodiments, the determined identity of the cable can be utilized to determine the appropriate signaling properties for driving that cable. Signaling properties can include, for example, the drive strength, slew rate, maximum voltage, frequency, or any combination of the above of a signal that is provided to drive the cable. These appropriate signaling properties may, for example, optimize the signal that is used to drive the cable while still allowing the cable to generate emissions that are within acceptable Electromagnetic Compatibility ("EMC") standards.

BRIEF DESCRIPTION OF THE FIGURE

The above and other objects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Figure 1:
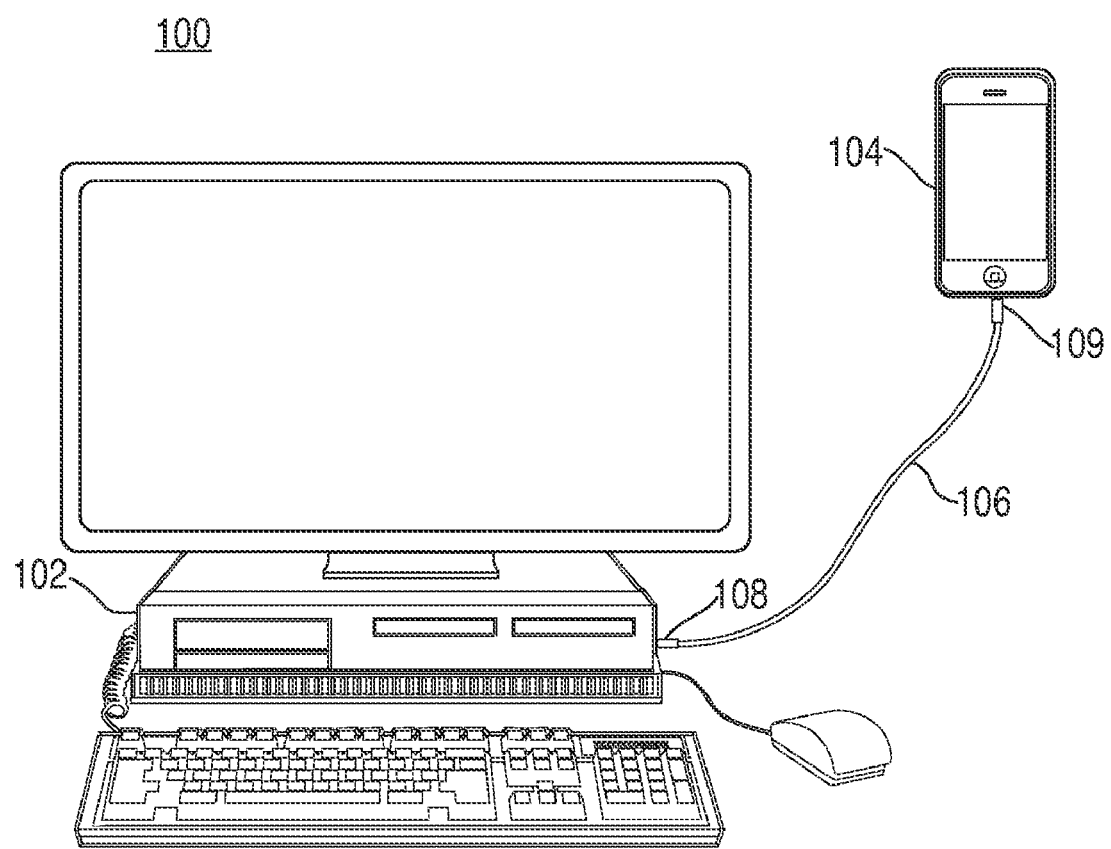
FIG. 1 shows an illustrative cable system in accordance with some embodiments of the invention.

FIG. 1 shows system 100. System 100 can include host device 102 that can be coupled to peripheral device 104 through cable 106. Generally, host device 102 and peripheral device 104 can be coupled together to exchange data, provide power, synchronize information, or perform any other suitable functions. Host device 102 and peripheral device 104 can include, for example, any combination of a laptop computer, a desktop computer, a digital media player (e.g., an iPod™ made available by Apple Inc. of Cupertino, Calif.), a printer, a scanner, a digital camera, a personal data assistant ("PDA"), a cellular telephone, a handheld gaming device, a personal e-mail device (e.g., a Blackberry™ made available by Research in Motion of Waterloo, Ontario), or any other suitable electronic device.

Figure 2:
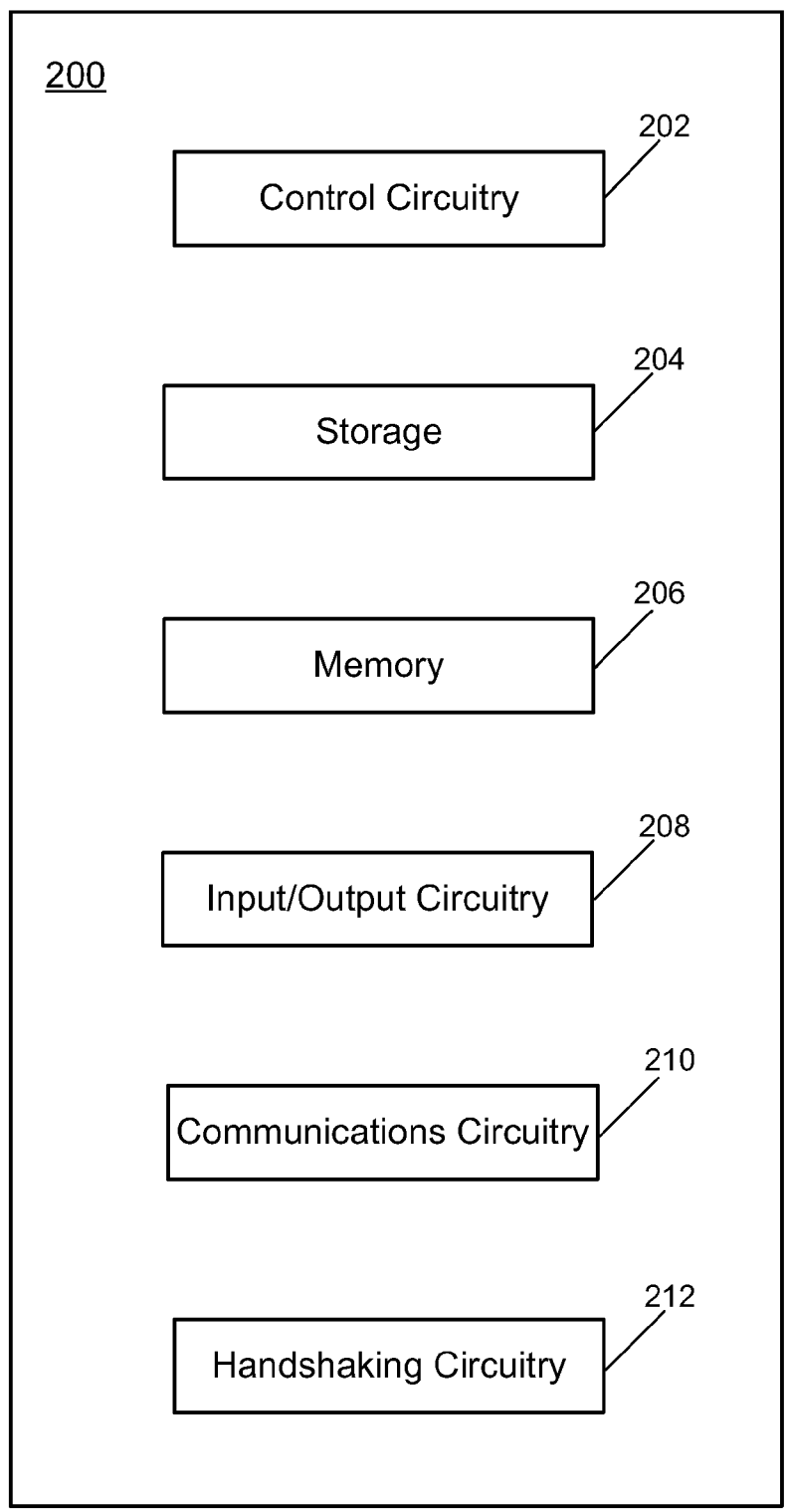
FIG. 2 shows a schematic view of an illustrative electronic device in accordance with some embodiments of the invention.

FIG. 2 shows a schematic view of an illustrative electronic device in accordance with some embodiments. For example, electronic device 200 can correspond to host device 102 of FIG. 1, peripheral device 104 of FIG. 1, or both. Electronic device 200 can include control circuitry 202, storage 204, memory 206, input/output circuitry 208, communications circuitry 210, and handshaking circuitry 212. In some embodiments, one or more of the components of electronic device 200 can be combined or omitted (e.g., storage 204 and memory 206 can be combined or handshaking circuitry 212 can be omitted). In some embodiments, electronic device 200 can include other components not combined or included in those shown in FIG. 2 (e.g., motion detection components, a power supply, or a bus), or several instances of the components shown in FIG. 2. For the sake of simplicity, only one of each of the components is shown in FIG. 2.

Control circuitry 202 can include any processing circuitry or processor operative to control the operations and performance of electronic device 200. For example, control circuitry 202 can be used to run operating system applications, firmware applications, hardware authorization or identification applications, or any other application. In some embodiments, control circuitry 202 can drive a display and process inputs received from a user interface of electronic device 200.

Storage 204 and memory 206 can include, for example, one or more storage mediums including a hard-drive, solid state drive, flash memory, ROM, cache memory, RAM, or any other suitable type of storage component, or any combination thereof. One or both of storage 204 and memory 206 can store, for example, media data (e.g., music, picture, and video files), application data (e.g., for implementing functions on electronic device 200), firmware, identification information (e.g. libraries of data associated with the identities of users, hardware, or both), hardware properties (e.g., libraries of data associated with cable attributes and their associated signaling properties), and any other suitable data or any combination thereof. In some embodiments, memory 206 and storage 204 can be combined as a single storage medium.

Input/output circuitry 208 can be operative to convert (and encode/decode, if necessary) analog signals and other signals into digital data, and vice-versa. For example, input/output circuitry 208 can be operative to convert signals received from any suitable input device of electronic device 200 such as, for example, a keyboard, a mouse, a switch, a button, an accelerometer, or a photodetector into digital data.

Communications circuitry 210 can include any suitable communications circuitry operative to connect to a communications network and transmit or receive communications (e.g., data) to and/or from electronic device 200. For example, in some embodiments, communications circuitry 210 can be utilized to couple electronic device 200 to an external database of information. As another example, communications circuitry 210 can be operative to interface with a communications network using any suitable communications protocol such as, for example, Wi-Fi (e.g., a 802.11protocol), Bluetooth®, near field communications ("NFC"), radio frequency systems (e.g., 900 MHz, 2.4 GHz, and 5.6GHz communication systems), infrared, GSM, GSM plus EDGE, CDMA, quadband, other cellular protocols, VOIP, or any other suitable protocol.

Handshaking circuitry 212 can include any suitable circuitry for authorizing a system, identifying a system, or both. In some embodiments, handshaking circuitry 212 can communicate with the handshaking circuitry of another system (e.g., another electronic device, cable, or any other suitable system) that is coupled to electronic device 200. For example, handshaking circuitry 212 can receive an appropriate signal or series of signals from the other handshaking circuitry of another device, cable, or system. In response to receiving the appropriate signal or series of signals, handshaking circuitry 212 can then authorize the other system for use with electronic device 200. As another example, handshaking circuitry 212 can receive a particular signal or series of signals from the other handshaking circuitry that is associated with the identity, properties, or both of the other system.

In some embodiments, electronic device 200 can include a bus operative to provide a data transfer path for transferring data to, from, or between control circuitry 202, storage 204, memory 206, input/output circuitry 208, communications circuitry 210, handshaking circuitry 212, and any other component included in electronic device 200.

As described in reference to FIG. 1, host device 102 can be coupled to peripheral device 104 through cable 106. Cable 106 can include any suitable cable, plugs, or both for coupling host device 102 to peripheral device 104. For example, cable 106 can include various cable-types such as a universal serial bus ("USB") cable, a Firewire cable, a local area network ("LAN") cable, an audio cable, a coaxial cable, an optical cable, a ribbon cable, or any other suitable cable-type. Although cable 106 is illustrated in FIG. 1 as having two plugs (e.g., plug 108 and plug 109), one skilled in the art can appreciate that in some embodiments cable 106 could split and include three or more plugs.

In some embodiments, in addition to being one of various cable-types (e.g., a USB cable, a serial port cable, a parallel port cable, or any other suitable cable-type), cable 106 can have various cable attributes. For example, a cable attribute can be associated with the length of the cable. In this case, cable 106 can include a cable that is 1000 millimeters in length, a cable that is 45 millimeters in length, or a cable of any other suitable length. In addition to cable length, cable attributes can include, for example, cable diameter, type of cable plug, type or presence of cable shielding, or any other suitable cable attribute.

Figure 3A:
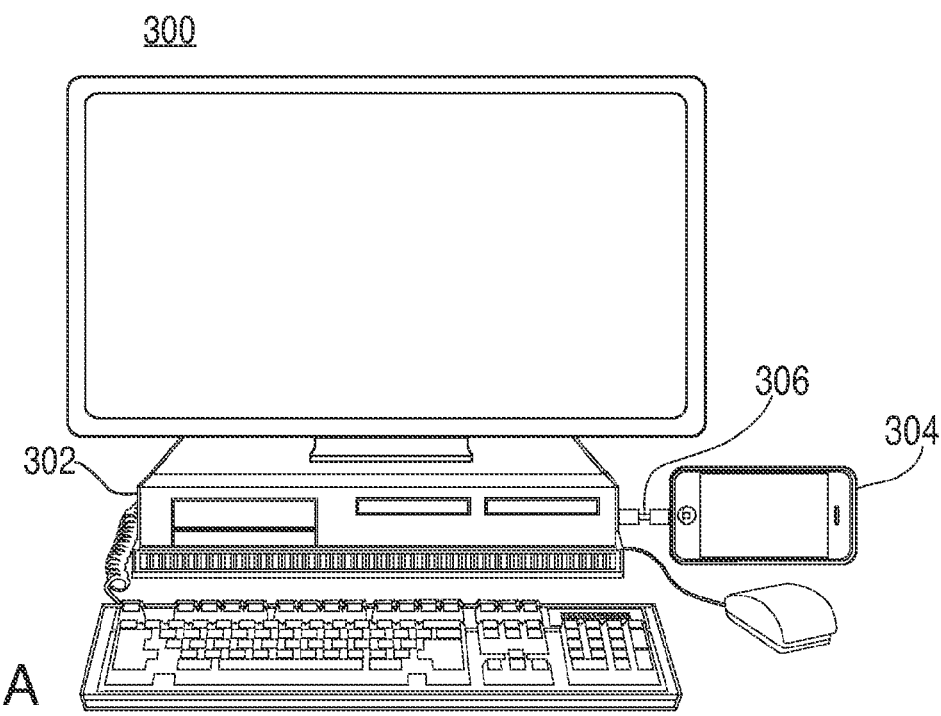
FIGS. 3A and 3B show illustrative cable systems including various cable attributes in accordance with some embodiments of the invention.
Figure 3B:
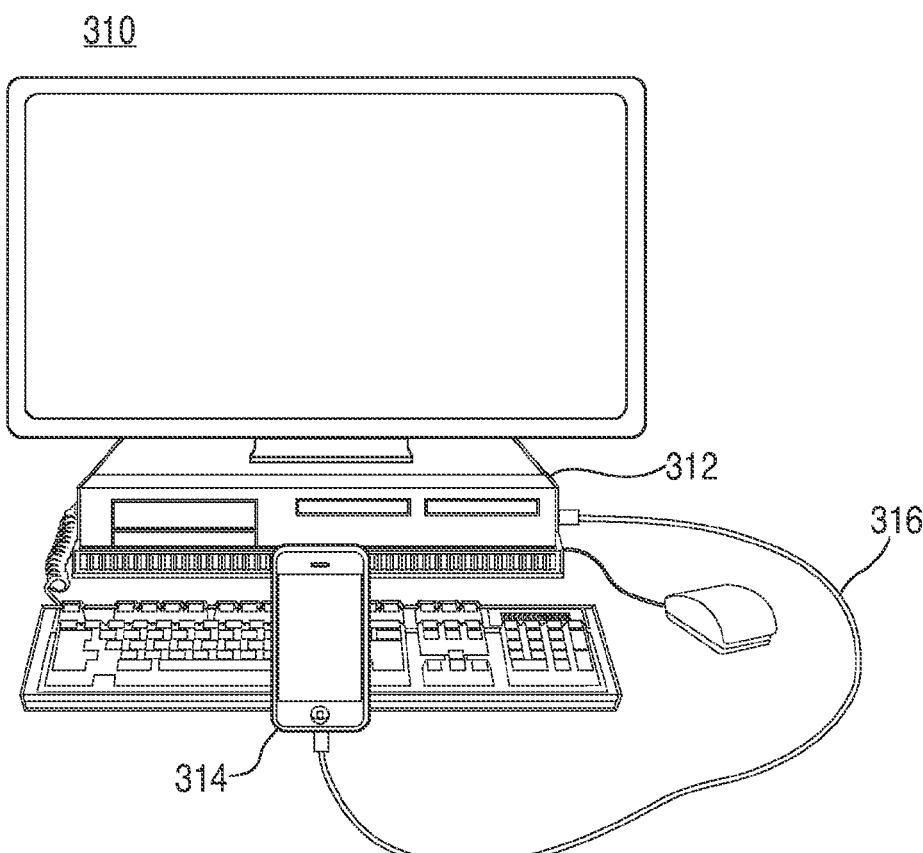

FIGS. 3A and 3B show cable systems 300 and 310 that can illustrate different cable attributes. For example, system 300 shows host device 302 that can be coupled to peripheral device 304 through cable 306. Cable 306 can be a certain cable-type (e.g., a USB cable) with a cable attribute that is short in length (e.g., 45 millimeters in length). System 310 shows host device 312 that can be coupled to peripheral device 314 through cable 316. In some embodiments, cable 316 can be the same cable-type as cable 306 (e.g., they may both be USB cables), but cable 316 may include different cable attributes than cable 306. For example, cable 316 can include a cable attribute that is long in length (e.g., 1000 millimeters in length) as opposed to a cable attribute that is short in length (e.g., 45 millimeters in length).

The different cable attributes of cable 306 and cable 316 may cause these cables to perform differently or may cause the amount of radiation emissions of systems 300 and 310 to be different. For example, cable 306 and cable 316 may be the same cable-type (e.g., they may both be USB cables) and may be driven with the same signal. However, due to the different cable attributes (e.g., due to the fact that cable 306 is a short cable and cable 316 is a long cable), cable 306 may generate more or less emissions than cable 316. Accordingly, based on the cable attributes of cable 306, the signaling properties of system 300 may need to be adjusted to control the emissions of cable 306. For example, the "signaling properties" of the signal driving cable 306 can be adjusted so that cable 306 may generate emissions that are within acceptable EMC standards. Similarly, based on the cable attributes of cable 316, the signaling properties of system 310 may need to be adjusted to control the emissions of cable 316.

The amount of emissions that are generated by a cable can be based on one or more of the signaling properties of a signal that is used to drive the cable. For example, a higher "drive strength" or a greater amount of power in a driving signal can increase the amount of emissions that are produced. Similarly, because the power of a signal can be related to the current and voltage of that signal, the voltage, current, or both of a driving signal can be associated with the amount of emissions. As another example, rapid changes in a signal can generate emissions. Accordingly, the slew rate (e.g., the rate at which a signal changes from low to high or visa-versa) of a driving signal can be associated with the amount of emissions. Similarly, the maximum voltage level can determine the speed at which a signal changes (e.g., can determine the slew rate) and thus can be associated with the amount of emissions. As another example, the rate of data transfer (e.g., the frequency of the signal) can be associated with the amount of the emissions. Thus, signaling properties such as drive strength, slew rate, maximum voltage, frequency, or any combination of the above can determine the amount of emissions that are generated by a cable driven with a signal including those signaling properties.

In general, one may drive a certain cable-type with the strongest signaling properties available for a standard cable of that cable-type (e.g., drive the cable with the strongest drive strength, with the fastest slew rate, with the highest maximum voltage, or any combination of the above). For example, in some embodiments, a particular cable-type (e.g., a USB cable) may be coupled to an electronic device (e.g., coupled to electronic device 200 of FIG. 2). The electronic device may then drive the USB cable with the strongest or substantially strongest signaling properties available for a standard USB cable. Due to the fact that the cable attributes can affect the amount of emission radiated by the cable, however, driving the USB cable with those signaling properties may or may not produce acceptable radiation emissions.

For example, a long USB cable driven with certain signaling properties may generate less emissions than a short USB cable that is driven with the same signaling properties (e.g., possibly due, at least partially, to the damping factor of the longer cable). Accordingly, driving the long USB cable with the "standard" signaling properties for a standard USB cable can result in the long USB cable generating emissions below the acceptable EMC standards. Thus, the electronic device can potentially drive the long USB cable with stronger signaling properties while still remaining within the acceptable EMC standards. Accordingly, the signaling properties for the long USB cable (e.g., or any other suitable cable-type) can be strengthened by driving the long USB cable with stronger signaling properties, where the strength of the signaling properties can be determined based on the length of the cable or on any other appropriate cable attribute.

Similarly, driving a short USB cable (e.g., or any other suitable cable-type) with the "standard" signaling properties for a standard USB cable can result in the short USB cable generating a high amount of emissions that fail to pass acceptable EMC standards. In this case, the short USB cable can be driven with weaker signaling properties (e.g., with a weaker drive strength, with a slower slew rate, with a lower maximum voltage, or any combination of the above), thus resulting in the short USB cable generating a lesser amount of emissions. Additionally, since a shorter cable can have more headroom in its eye diagram than a longer cable (e.g., can have more flexibility with the amount of noise, jitter, and skew that is allowed in a signal driving the cable), the short USB cable can generally afford to reduce its signaling properties while still continuing to operate properly.

Accordingly, in some embodiments a system can adjust the signaling properties for a cable based on the identity of that cable. For example, in some embodiments, a system can identify a cable that is coupled to the system by determining the cable attributes of that cable. Based on the identified cable attributes, the system can then determine the appropriate signaling properties for driving that cable. For example, the system can determine the strongest signaling properties that can be used to drive the cable while still allowing the cable to generate emissions that are within acceptable EMC standards.

In some embodiments, when identifying a cable, a system can alternatively or additionally identify the cable-type of the cable that is coupled to the system. This operation can be performed when, for example, multiple cable-types can couple to the same port of a system. Accordingly, the system may determine the cable-type, the cable attributes, or both of the cable that is coupled to that port. The system can then determine the appropriate signaling properties for driving that cable based on the cable-type, the cable attributes, or both.

In some embodiments, a host device (e.g., host device 102 of FIG. 1) or peripheral device (e.g., peripheral device 104 of FIG. 1) can determine the cable attributes and/or cable-type of a cable (e.g., for cable 106 of FIG. 1). The host device or peripheral device can then determine the appropriate signaling properties for that cable based on the cable attributes and/or cable-type. The host device or peripheral device may then provide a driving signal with those determined signaling properties to drive the cable. In some embodiments, rather than providing the driving signal itself, the host device can determine the signaling properties and then transmit a request to the peripheral device. This request can instruct the peripheral device to provide a driving signal with those signaling properties. Similarly, in some embodiments, the peripheral device can determine the signaling properties and then transmit a request to the host device instructing the host device to use those signaling properties.

Figure 4:
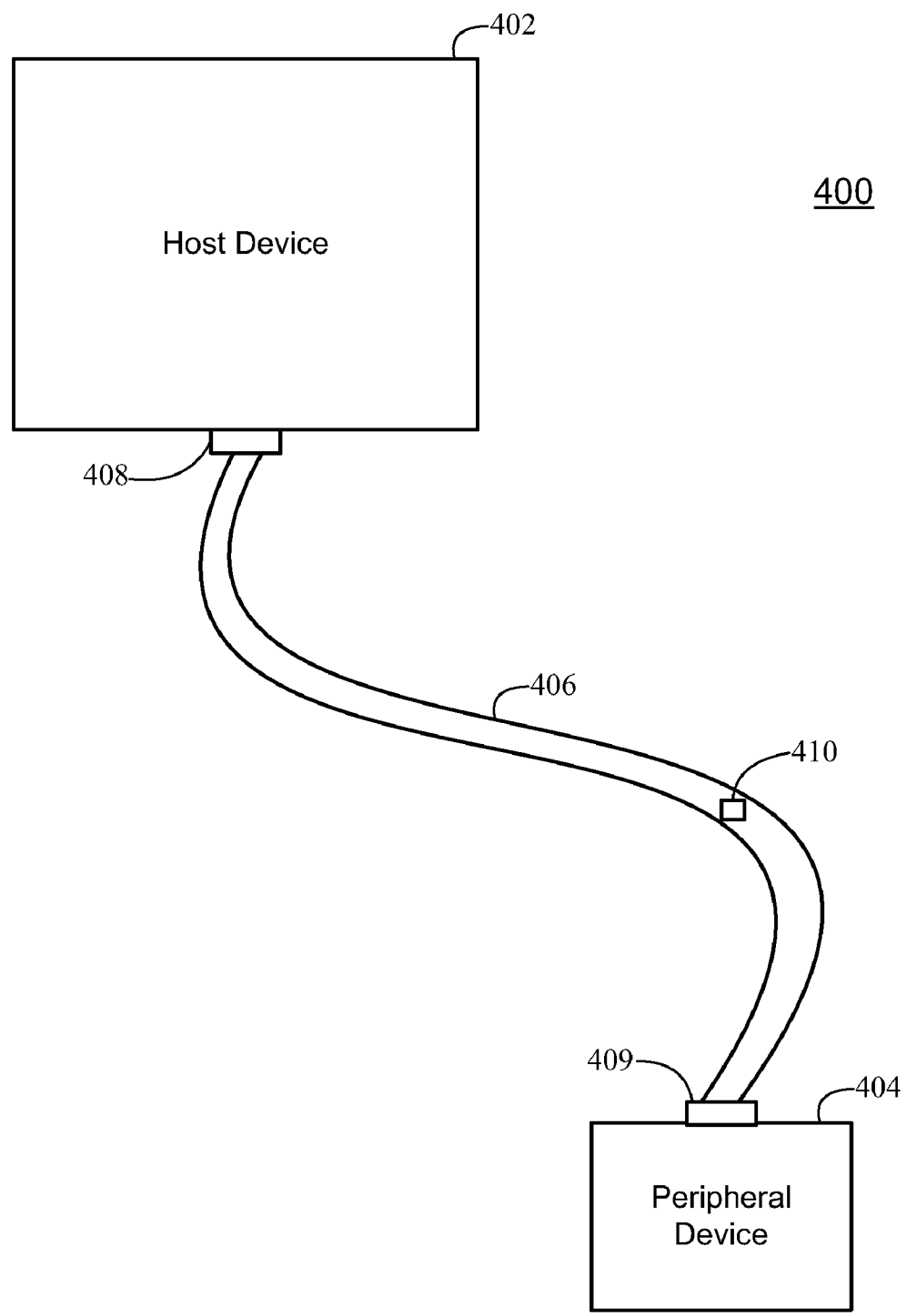
FIG. 4 shows an illustrative cable system including on-cable circuitry in accordance with some embodiments of the invention.

As mentioned above, in order to determine the appropriate signaling properties of a signal driving a cable, a system can identify the cable that is coupled to the system. In some embodiments, a cable can include cable circuitry that can be utilized to identify the cable. For example, FIG. 4 shows system 400 that can include cable circuitry 410 used to identify cable 406. Cable 406 can couple to host device 402 and to peripheral device 404 through, respectively, plug 408 and plug 409. In some embodiments, cable circuitry 410 can communicate with a processor in host device 402 or peripheral device 404 such as, for example, a processor included in control circuitry 202 of FIG. 2. In some embodiments, cable circuitry 410 can communicate with dedicated handshaking circuitry in host device 402 or peripheral device 404 such as, for example, handshaking circuitry 212 of FIG. 2.

In some embodiments, cable circuitry 410 can transmit a particular signal that is associated with the identity of cable 406 to host device 402, peripheral device 404 or both. For example, the signal can include a series of power signal spikes, a series of sine waves, a series of bits or data, or any other appropriate signal that may be associated with the identity of cable 406. For example, the signal can be associated with the cable-type, cable attributes, or both of cable 406.

In some embodiments, in addition to or instead of utilizing cable circuitry, the identity of a cable can be "hardwired" into the cable. For example, a particular combination of pins in a plug of the cable can be shorted, can be maintained at a certain value (e.g., with certain voltage values), or both. This particular combination of pins can then be associated with the identity of the cable. Accordingly, by analyzing the pins of the cable, the identity of the cable can be determined.

As mentioned above, the identity of a cable (e.g., the cable-type, cable attributes, or both) can be used to determine the appropriate signaling properties for that cable. For example, in order to determine the signaling properties, the identity of the cable can be compared to a database of information containing cable identities and their associated signaling properties. In some embodiments, the database of information can be stored locally in the system. For example, the database can be stored in local memory such as memory 206 of FIG. 2. In some embodiments, the database of information can be stored in a remote database that is external to the system. In this case, the system can connect to and communicate with the remote database through communications circuitry such as, for example, communications circuitry 210 of FIG. 2.

In some embodiments, a system can automatically determine the appropriate signaling properties of a cable. For example, the system can analyze cable identity information (e.g., the cable-type, cable attributes, or both) and calculate the signaling properties for driving that cable from this information.

In some embodiments, rather than receiving information associated with the cable's identity and determining the appropriate signaling properties from the cable's identity, the system can receive information directly associated with the appropriate signaling properties. For example, cable circuitry (e.g., cable circuitry 410 of FIG. 4) can communicate the cable's signaling properties to the host device, the peripheral device, or both. As another example, the cable can be hardwired with information directly associated with its signaling properties.

Figure 5:
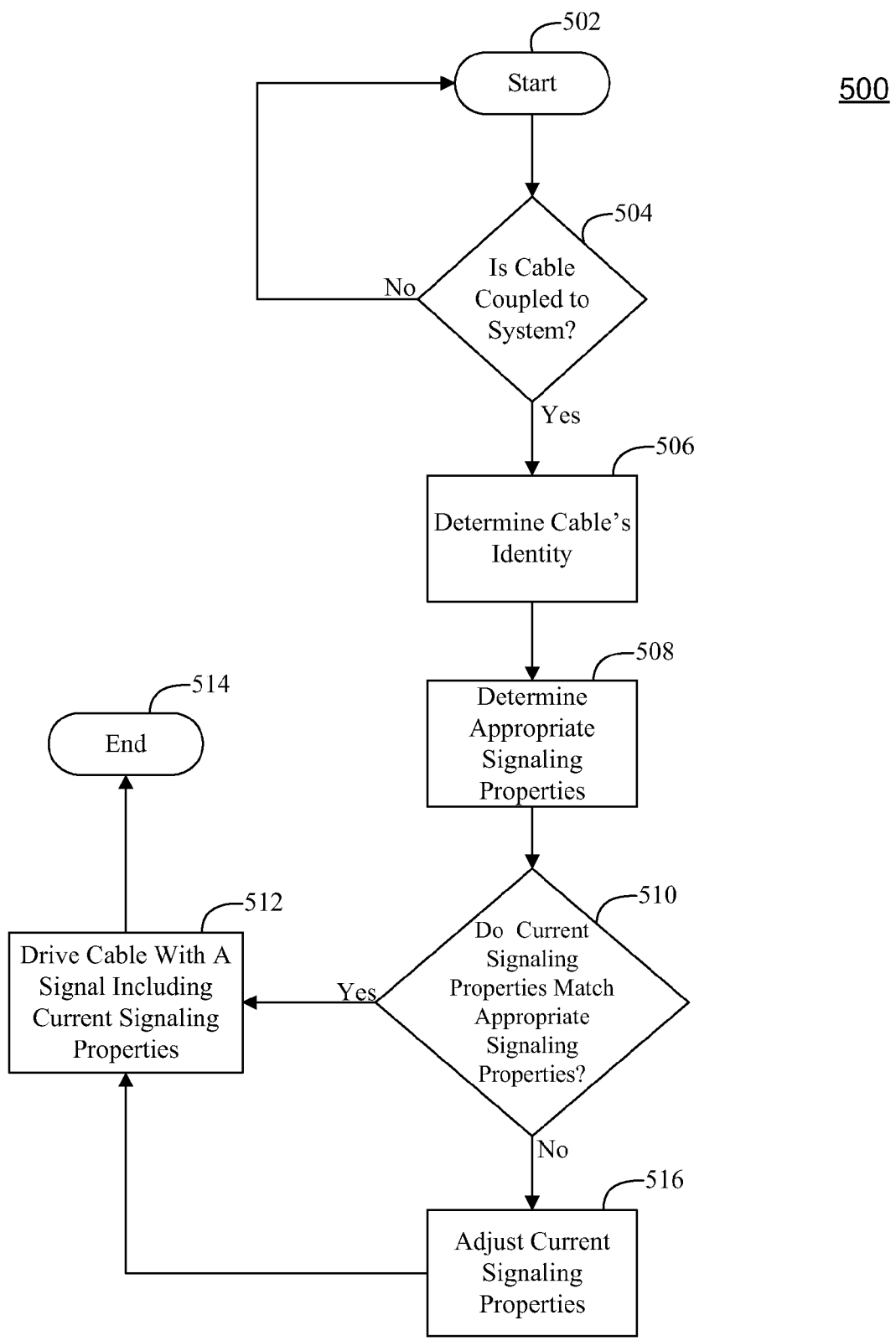
FIG. 5 shows an illustrative process for adjusting signaling properties in accordance with some embodiments of the invention.

FIG. 5 shows process 500 that can adjust signaling properties of a signal based on the identity of a cable. Process 500 can begin a step 502. At step 504, process 500 can determine whether a cable has been coupled to the system. If a cable is not coupled to the system, process 500 can continue to repeat steps 502 and 504 until a cable is coupled to the system.

When a cable is coupled to the system, process 500 can determine the cable's identity at step 506. For example, as described above, information such as the cable-type, cable attributes, or any combination of the above can be determined. Also as described above, the identity of the cable can be determined by, for example, communicating with cable circuitry, analyzing the hardwired attributes of the cable, or both.

At step 508, the appropriate signaling properties for the cable can be determined. For example, the identity of the cable can be compared to a database of information including cable identities and their associated appropriate signaling properties. In some embodiments, the database can be a local database or a remote database. As another example, process 500 can automatically determine the appropriate signaling properties by calculating these properties from information associated with the identity of the cable (e.g., from information such as the cable-type, the cable's length, the cable's diameter, the type of plugs on the cable, the type or presence of cable shielding, or any combination of the above).

At step 510, the current signaling properties of the system can be compared with the appropriate signaling properties to determine whether they match. For example, properties such as the drive strength, slew rate, maximum voltage, frequency, or any combination of the above, can be compared. In response to the current and appropriate signaling properties matching, adjustments to the driving signal may not be required. Accordingly, a signal including the current signaling properties can be used to drive the cable at step 512. Process 500 can then end at step 514.

In response to the current and appropriate signaling properties not matching, the current signaling properties can be adjusted at step 516. For example, current signaling properties such as the drive strength, slew rate, maximum voltage, frequency, or any combination of the above can be adjusted to match the appropriate signaling properties. A signal including the now-current signaling properties (e.g., the signaling properties that have been adjusted at step 516) can be now used to drive the cable at step 512. Process 500 can then end at step 514.

The processes discussed above are intended to be illustrative and not limiting. Persons skilled in the art can appreciate that steps of the processes discussed herein can be omitted, modified, combined, or rearranged, or that any combination of these steps or any additional steps can be performed without departing from the scope of the invention. For example, in some embodiments step 506 can be omitted and process 500 can directly determine the appropriate signaling properties from the cable without first determining information such as the cable-type or cable attributes.

It will be apparent to those of ordinary skill in the art that methods involved in the invention may be embodied in a computer program product that includes a machine readable and/or usable medium. For example, such a computer usable medium may consist of a read only memory device, such as a CD ROM disk or conventional ROM device, or a random access memory, such as a hard drive device or a computer diskette, or flash memory device having a computer readable program code stored thereon.

The above described embodiments of the invention are presented for purposes of illustration and not of limitation, and the invention is limited only by the claims which follow.

What is claimed is:

1. A method for adjusting signaling properties comprising:
determining a cable identity of a cable;
determining at least one appropriate signaling property for driving the cable based on the determined cable identity; and
adjusting at least one current signaling property to match the at least one appropriate signaling property;
wherein the determining the at least one appropriate signaling property comprises matching the determined cable identity with a particular cable identity from a plurality of cable identities, wherein the particular cable identity is associated with the at least one appropriate signaling property; wherein the determining the at least one appropriate signaling property comprises matching the determined cable identity with a particular cable identity from a plurality of cable identities, wherein the particular cable identity is associated with the at least one appropriate signaling property.

2. A method for adjusting signaling properties comprising:
determining a cable identity of a cable;
determining at least one appropriate signaling property for driving the cable based on the determined cable identify; and
adjusting at least one current signaling property to match the at least one appropriate signaling property,
wherein the adjusting the at least one current signaling property comprises providing a driving signal comprising the at least one appropriate signaling property.

3. The method of claim 2, wherein the determining the cable identity comprises determining at least one cable attribute of the cable.

4. The method of claim 2, wherein the determining the cable identity comprises:
receiving a signal from cable circuitry of the cable; and
identifying the cable identity associated with the received signal.

5. The method of claim 2, wherein the determining the at least one appropriate signaling property comprises matching the determined cable identity with a particular cable identity from a plurality of cable identities, wherein the particular cable identity is associated with the at least one appropriate signaling property.

6. The method of claim 2, wherein the determining the at least one appropriate signaling property comprises calculating the at least one appropriate signaling property from data associated with the cable identity.

7. The method of claim 2, wherein the adjusting the at least one current signaling property comprises:
comparing the at least one appropriate signaling property to the at least one current signaling property;
detecting that the at least one appropriate signaling property does not match the at least one current signaling property; and
adjusting the at least one current signaling property to match the at least one appropriate signaling property in response to the detecting.

8. The method of claim 2, wherein the providing the driving signal comprises transmitting instructions to a remote electronic device, and wherein the instructions direct the remote electronic device to provide the driving signal.

9. An electronic device comprising:
a port configured to couple the electronic device to a cable;
a signal generator; and
a processor configured to:
- identify at least one cable attribute of the cable;
- determine at least one appropriate signaling property associated with the at least one cable attribute; and
- direct the signal generator to provide a driving signal to drive the cable, wherein the driving signal comprises the at least one appropriate signaling property, wherein the at least one appropriate signaling property comprises calculating the at least one appropriate signaling property from data associated with the cable identity.

10. An electronic device comprising:
a port configured to couple the electronic device to a cable;
a signal generator; and
a processor configured to:
- identify the at least one cable attribute of the cable;
- determine at least one appropriate signaling property associated with the at least one cable attribute; and
- direct the signal generator to provide a driving signal to drive the cable, wherein the driving signal comprises the at least one appropriate signaling property, wherein the at least one appropriate signaling property comprises at least one of a drive strength, a slew rate, a maximum voltage, and a frequency.

11. The electronic device of claim 10, wherein the at least one cable attribute is associated with at least one of the cable's length, the cable's diameter, a type of plug coupled to the cable, and a type of shielding of the cable.

12. The electronic device of claim 10, wherein the processor is further configured to:
- determine the voltage level of at least one pin of the port; and
- determine the at least one cable attribute based on the determined voltage level.

13. The electronic device of claim 10 further comprising handshaking circuitry configured to receive information from the cable associated with the at least one cable attribute.

14. The electronic device of claim 10, further comprising a storage device configured to store a plurality of cable attributes and their associated appropriate signaling properties.

15. The electronic device of claim 14, wherein the processor is further configured to determine the at least one acceptable signaling property by identifying at least one particular cable attribute of the plurality of cable attributes that matches the identified at least one cable attribute of the cable.

16. An electronic device comprising:
a port configured to couple the electronic device to a cable;
a signal generator;
a processor configured to:
- identify at least one cable attribute of the cable;
- determine at least one appropriate signaling property associated with the at least one cable attribute; and
- direct the signal generator to provide a driving signal to drive the cable, wherein the driving signal comprises the at least one appropriate signaling property; and
communications circuitry configured to:
- transmit the at least one identified cable attribute to a remote device; and
- receive the at least one appropriate signaling property from the remote device in response to the transmitting.

17. A cable comprising:
a plug configured to couple to an electronic device; and
cable circuitry configured to transmit a first signal associated with an appropriate signaling property of the cable to the electronic device.

18. The cable of claim 17, wherein the cable is configured to receive a driving signal from the electronic device in response to the cable circuitry transmitting the first signal, and wherein the driving signal comprises the appropriate signaling property.

19. The cable of claim 18, wherein the driving signal causes the cable to generate less than a predetermined amount of radiation emissions.

20. The cable of claim 17, wherein the appropriate signaling property is associated with the length of the cable.

21. An apparatus configured to couple to a cable, the apparatus comprising:
control circuitry configured to:
- determine a cable is coupled to the apparatus;
- detect a length of the cable in response determining a cable is coupled to the apparatus; and
- determine a signal slew rate based on the length; and
a cable interface configured to provide a driving signal comprising the signal slew rate to the cable.

22. The apparatus of claim 21, wherein the control circuitry is further configured to:
- determine the length of the cable is short in length; and
- increase the value of the signal slew rate in response to determining the length is short.

23. Machine-readable media comprising machine-readable instructions recorded thereon for:
- determining a cable identity of a cable;
- determining at least one appropriate signaling property for driving the cable based on the determined cable identify; and
- adjusting at least one current signaling property to match the determined at least one appropriate signaling property, wherein the adjusting the at least one current signaling property comprises providing a driving signal comprising the determined at least one appropriate signaling property, wherein the adjusting the at least one current signaling property comprises providing a driving signal comprising the determined at least one appropriate signaling property.

* * * * *